LIGHT-EMITTING AND PHOTO-SENSITIVE DEVICES

Filed Jan. 26, 1961

3,254,266
Patented May 31, 1966

3,254,266

LIGHT-EMITTING AND PHOTO-SENSITIVE DEVICES

Brian Clifford Fleming-Williams, London, England, assignor to Sylvania-Thorn Colour Television Laboratories Limited, London, England, a British company Filed Jan. 26, 1961, Ser. No. 85,087
Claims priority, application Great Britain, Feb. 5, 1960, 4,245/60
4 Claims. (Cl. 315—161)

The present invention relates to light-emitting devices which are responsive to exciting signals of particular frequencies only and to photo-sensitive devices which can provide output signals of amplitude dependent upon the amount of incident light in response to applied signals of particular frequencies.

Previous proposals have been made to control the emission of light from electroluminescent material by means of piezo-electric filters by connecting a piezo-electric filter in series with a series resonant circuit having the same resonance frequency as the piezo-electric filter and comprising an electroluminescent capacitor in series with a tuning inductor. An applied alternating voltage only excites luminescence when at the said resonance frequency since the high Q piezo-electric filter otherwise acts virtually as an open circuit. It has been noted that, at resonance, the said series resonant circuit which is a low Q circuit causes the alternating voltage across the electroluminescent capacitor to exceed the applied voltage in amplitude.

The present invention in its first aspect is based upon the discovery that it is possible to obtain a magnifying effect without providing the low Q series resonant circuit and that a frequency-sensitive light emitting device can be made without the use of any tuning inductor. Thus it has been found that, if a body of piezo-electric material and an untuned electroluminescent capacitor are connected in series, an applied alternating voltage of amplitude less than that required across the electroluminescent capacitor to excite luminescence can excite luminescence, so long as the voltage alternates at or near a resonance frequency of the piezo-electric body.

The electroluminescent capacitor can be formed directly upon a surface of the piezo-electric body.

Clearly the Q of the electromechanical circuit determines both how great the amplitude of the potential across the electroluminescent material is relative to the amplitude of the exciting potential, and how near to resonance it is necessary to be for light to be emitted.

Such a device can be used to indicate the presence or absence of a particular frequency and a plurality of the devices having different resonance frequencies can be used as a frequency meter broadly similar to a vibrating reed frequency meter.

In the invention in another aspect the piezo-electric body has two parts with planes of electrical polarization at right angles, one part being connected between the said terminals and the other part being in contact with the electroluminescent material, whereby when resonance is induced by the applied voltage the potential deveoped across the said other part excites the electroluminescent material. In this way it is possible to remove the electroluminescent material from the exciting circuit, avoiding the necessity of making connection to a transparent electrode overlying the material. Considerable structural simplification results.

According to the invention in another aspect there is provided a display arrangement comprising an array of devices as hereinbefore defined and having different resonance frequencies, the said terminals of each device being constituted by two terminals common to all devices.

When an exciting signal is applied to the said common terminals the different devices will emit light with intensities dependent upon the amplitudes of the respective components at the different resonance frequencies in the exciting signal. Such an arrangement can be used to show the frequency spectrum of the exciting signal and a visual estimate of relative amplitudes may be made from the brightness of the different devices. Further, such an arrangement may be used to display information carried by the exciting signal in accordance with the content of the different resonance frequencies.

A system for displaying information can comprise a display arrangement as hereinbefore defined, wherein the said array is a two-dimensional array, and means adapted to generate and apply to the arrangement an exciting signal containing a combination of frequencies selected from all the different resonance frequencies, whereby, in use, for different selected combinations different patterns of illumination over the said array are set up. The said means may be further adapted to vary the relative amplitudes of the components of the different selected frequencies whereby, in use, the intensity of illumination may be varied over the said pattern.

Such a system can be used to display letters, numerals and other symbols. The different selected combinations will then correspond to the different symbols to be displayed and it is not necessary for the said means to be able to vary the amplitudes as aforesaid. On the other hand the system can constitute a television system, the display arrangement constituting the picture display device at the receiver and the said means constituting the transmitter.

In the specification of British Patent No. 233,746 Fournier d'Albe proposed to allocate individual frequencies to different picture elements and transmit a signal containing components at all these frequencies, each component having the amplitude proper to the picture being transmitted. It was proposed to use frequencies in the audio range and, at the receiver, to employ an array of acoustical resonators excited for example from a loudspeaker fed with the received signal. Each resonator could be provided with a silvered membrane or reed from which light was reflected on to a screen, the visibility of each picture element depending upon how much its spot of light was drawn out into a relatively large patch by excitation of the pertaining resonator. When not so drawn out the spot falls on an absorbing part of the screen but extends on to a reflecting part when drawn out by vibration of the silvered membrane or reed.

In such a television system the transmitted signal is unlike what is now regarded as a conventional television signal. No scanning raster is used in the display arrangement and no synchronising pulses are required. A given picture element is not seelcted by means of a scanning process but by a particular frequency in the exciting signal (which can be transmitted on a suitable carrier of course). The question of flicker does not arise. A further advantage lies in the fact that an arrangement according to the invention can be flat and relatively thin, unlike the conventional cathode ray tube. These important advantages all pertain equally to a television system embodying the present invention, in which however the impracticabilities inherent in the proposal to use acoustic resonators are avoided.

It will further be apparent that the devices in an arrangement according to the invention need not all emit the same coloured light. Accordingly, colour television pictures can be displayed. The said means constituting the transmitter in a television system according to the invention must be capable of generating all the different resonance frequencies and of amplitude-modulating the components at these frequencies individually in accordance with the picture to be transmitted. The said means may comprise an array of devices similar to the devices already referred to but wherein the electroluminescent material is replaced by a photo-conductive material. These latter devices will be referred to as photo-sensitive devices to distinguish from the light-emitting devices. A photo-sensitive device can only pass an appreciable current if the applied signal is at the appropriate resonance frequency and moreover the amplitude of the current passed will be controlled by the conductivity of the photoconductive material and hence by the incident light.

According to the invention in yet another aspect, therefore, a photo-sensitive device comprises a body of piezo-electric material having terminals for the application of a signal at a resonance frequency of the body and a quantity of photo-conductive material electrically in circuit with at least part of the said body and a load, the arrangement being such that when, in operation, a signal at the said resonance frequency is applied to the said terminals a current of the same frequency flows through the load, the amplitude of the current increasing and decreasing with increase and decrease in the amount of light incident upon the photo-conductive material.

According to the invention in yet another aspect a photo-sensitive arrangement comprises an array of photosensitive devices as just defigned and having different resonance frequencies, the said load of each device being constituted by a load common to all devices.

There is further provided such a photo-sensitive arrangement in combination with means adapted to apply signals of the different resonance frequencies to the different devices. The said means may generate a signal having components at all the different resonance frequencies and apply this signal to all the photo-sensitive devices in common, the said terminals of each device being constituted by two terminals common to all the devices. The said signal may be generated as pulses of such shape, duration and repetition frequency as to give all the required resonance frequencies.

The invention further provides a television system comprising a display arrangement and a photo-sensitive arrangement as hereinbefore defined, the said arrays in the two arrangements being like, two-dimensional arrays and any device in one array and the correspondingly located device in the other array having the same resonance frequency, a lens system for focusing an image on the photosensitive arrangement, means adapted to apply signals of the different resonance frequencies to the different devices in the photo-sensitive arrangement, means adapted to transmit the signal developed across the said common load to the display arrangement and means adapted to amplify the received signal and to apply the amplifier signal to the said common terminals of the display arrangement.

In an alternative form of the invention in this aspect, the resonance frequencies of each pair of corresponding devices, one in the display arrangement and one in the photo-sensitive arrangement, are not equal but bear a prescribed relationship to each other and frequency changing means are included in the link between the two arrangements, whereby the two arrangements operate in different frequency bands.

In both light-emitting and photo-sensitive devices the piezo-electric material may be quartz or a ceramic containing barium titanate or lead zirconate, for example.

It is not necessary in an arrangement comprising a plurality of frequency-sensitive, light-emitting devices to form the bodies of the individual devices separately and to assemble the latter. A number of bodies may be formed by slotting or otherwise cutting into a blank of piezo-electric material in such a way as to form bodies which whilst connected by "bridges" of material can nevertheless resonate individually. In order to obtain connected bodies in this way which have different resonance frequencies the blank may taper in one dimension, whereby the bodies have one dimension varying from each to each.

A number of embodiments of the invention in its different aspects will now be described, by way of example, with reference to the accompanying diagrammatic drawings, in which.

Figure 1:
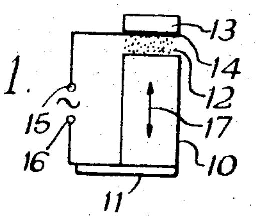
FIG. 1 shows a light-emitting device.

The light-emitting device shown in FIG. 1 comprises an elongated block 10 of piezo-electric material which may be a ceramic containing barium titanate having a metallic conductor 11 applied to one end thereof. On the other end of the block is provided a layer 12 of electroluminescent material on which is placed a glass plate 13, coated on its underside with a transparent conducting film 14 of stannic oxide, for instance. Terminals 15 and 16 are connected to the layer 14 and the conductor 11 respectively, and an alternating signal of R.M.S. value, say, 50 volts, is applied between these terminals. A potential of 50 volts is not sufficient to cause the electroluminescent layer 12 to emit light. The block 10 may have a resonance frequency for the longitudinal mode of vibration indicated by the arrows 17 of, say, 100 kc./s. The block is polarized in this direction. If the frequency of the alternating signal is varied until this resonance frequency is reached it is found that light is emitted from the layer 12. This is because a voltage greater than that applied appears across the electroluminescent layer 12. The greater the Q of the resonant block of the piezoelectric material the higher will be the voltage appearing across the electroluminescent layer and the narrower will be the band of frequency about 100 kc./s. for which light will be emitted. With an applied exciting voltage of 50 volts it has been found that there is no difficulty in generating 200 volts or more across the elctroluminescent layer, this voltage being ample to cause the emission of light.

Figure 2:
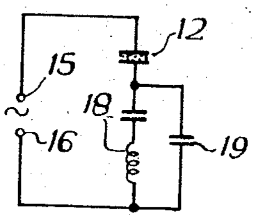
FIG. 2 shows an equivalent circuit.

FIG. 2 shows the probable equivalent circuit of the device shown in FIG. 1. The electroluminescent layer 12 represents a capacitor in series with a series resonant circuit 18 which is the electrical equivalent of the resonant block 10. A capacitor 19 in parallel with the series resonant circuit represents the stray capacitance across the resonator. Depending on the relative values of the elements in this circuit, it can be seen that, at resonance, a higher voltage will appear across the capacitor 12 than is applied between the terminals 15 and 16.

The particular construction of electroluminescent layer and glass plate with a conductive coating is shown merely by way of example. An alternative way of making an electroluminescent lamp consists of sintering a mixture of electroluminescent powder and glass frit on to a metal plate. After sintering the top of the sintered glass is rendered conducting by spraying, whilst hot, with stannic chloride. A lamp of this nature could be formed directly on the top of the quartz block 10 (instead of on a metal plate) and connection be made to the oxide layer formed by spraying with stannic chloride. It is apparent that a number of devices such as are shown in FIG. 1 can be mounted together with common connections to the layer 14 and the conductors 11. If the blocks have different resonance frequencies the arrangement can be used as a frequency meter, the frequency of the applied exciting signal being indicated by the particular one of the electroluminescent layers which emits light.

Figure 3:
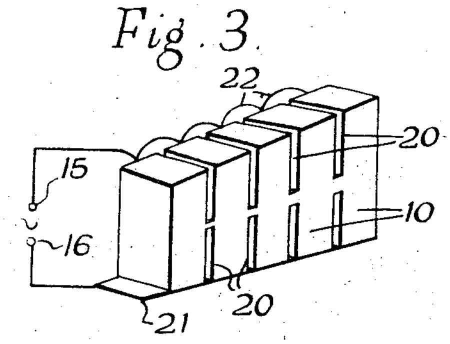
FIG. 3 shows a linear array of light-emitting devices.

FIG. 3 shows a simplified form of construction for an arrangement comprising a plurality of devices having different resonance frequencies. The arrangement may be made from a blank of piezo-electric material having dimensions, say, 30 x 20 x 5 mm. One edge of the blank is then cut or ground so as to form a wedge tapering from 20 mm. down to, say, 13 mm., the wedge thus being 30 mm. long and 5 mm. thick. Saw cuts are then made as indicated at 20 in FIG. 3, whereby the wedge is divided into a number of blocks of different length connected by small bridges of material which may be 2 mm. thick. As shown, five blocks are thus formed and with the dimensions given the blocks will have resonance frequencies of the longitudinal mode of vibration in the frequency range of 100 to 150 kc./s. The actual resonance frequencies will depend in part on the mechanical properties of the piezo-electric material used and the correct dimensions to give a particular frequency will have to be determined empirically. A thin strip of metal foil 21 is attached to the bottom end of all the blocks. On the top end of each block is formed an electroluminescent layer covered with a transparent conductive coating (not shown) and a lead 22 is connected to all the conducting layer. The terminals 15 and 16 are connected to the lead 22 and the foil 21 respectively. The exciting signal applied between the terminals 15 and 16 may again have an R.M.S. value of the order of 50 volts and if this signal has a frequency between 100 kc./s. and 150 kc./s. the electroluminescent layer of one of the devices will light up. If the exciting signal contains two or more frequency components within its range, two or more of the devices will light up. The frequency discrimination of such an arrangement depends directly on the Q of the individual resonators. With a Q of the order of 1000 individual resonators can be tuned in steps of 0.1%. Accordingly, a wedge as shown in FIG. 3 could be cut into many more than five blocks.

As an example of an application of such an arrangement it may be mentioned that transducers are known with an output whose frequency is a function of the displacement of the moving portion of the transducer. (The transducer may comprise an oscillator including a capacitor with one movable pressure-sensitive plate). A frequency meter is commonly employed in conjunction with such a transducer, but the arrangement described may be used to give a visual display of the output frequency, and hence of the variable causing displacement of the said moving portion.

Figure 4:
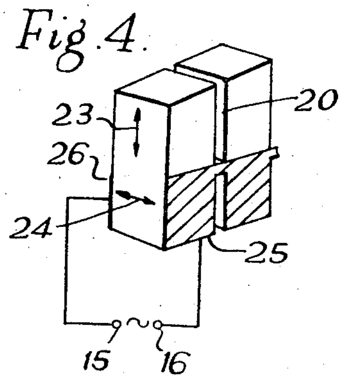
FIG. 4 illustrates a modification of the arrangement of FIG. 3.

In the arrangement shown in FIG. 3 it is necessary to make individual connections to a large number of electroluminescent elements. This is avoided in the arrangement shown in FIG. 4, in which only two blocks of a slotted wedge such as is shown in FIG. 3 are shown. In this embodiment the upper and lower halves of each resonant block are polarised differently as indicated by the arrows 23 and 24. The lower halves of the two side faces of each block are coated with electrodes 25 and 26 respectively and the terminals 15 and 16 are connected to these electrodes. Thus, resonant vibration of a block may be induced by the field generated transversely across the lower part of the block. It will be apparent, however, that, because a stress applied along one axis of the block causes strains along all axes, it is possible to excite resonant vibration in the longitudinal mode (in the direction of arrow 23) by means of the transverse field applied in the direction of arrow 24. When one of the elements is excited to resonant vibration in the longitudinal mode (at right angles to the applied field) a voltage will appear across the slot 20 between the upper end of the resonating block and the upper end of the adjacent block. Hence, if this slot is filled with electroluminescent powder in a suitable binder, the powder will light up as before. The ratio of the voltage generated across the slot to that applied between the terminals 15 and 16 is dependent upon the thickness of the block between the electrodes 25 and 26. By adjusting this thickness it is possible to obtain a greater voltage across the electroluminescent material for a given exciting voltage than is the case with the embodiment shown in FIG. 1. As shown, the slot is narrow compared with the thickness of the resonant blocks, but this need not necessarily be so.

Figure 5:
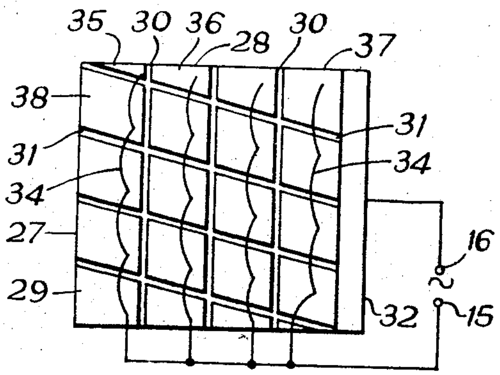
FIG. 5 illustrates a two-dimensional array of light-emitting devices in plan view.
Figure 6:
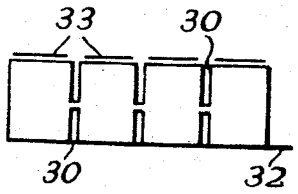
FIG. 6 is an elevation of the arrangement shown in FIG. 5.

FIG. 5 shows one example of an arrangement made up of a two-dimensional array of light emitting devices. A block of quartz 27 is ground so that its upper edge 28 is thinner than its lower edge 29. Slots 30 are cut perpendicular to these edges, as is also indicated in FIG. 6 which shows the edge 29 in elevation. Slots 31 traverse the slots 30 at such an angle that the left-hand end (in the drawing) of one slot is in line with the right-hand end of the adjacent slot. It will be apparent from the foregoing that a plurality of blocks of graduated mean lengths are thus formed. A layer of metal foil 32 is applied to the underside of all the blocks and electroluminescent layers covered with conducting layers are formed on the tops of the blocks as indicated schematically at 33 in FIG. 6. Leads 34 (FIG. 5) connect the conducting layers to the terminal 15 whilst the terminal 16 is connected to the foil 32.

This arrangement operates in the same way as do the previously described embodiments. It can be seen, for example, that if the exciting signal applied between the terminals 15 and 16 is gradually reduced in frequency the top left-hand device 35 will light up first, then the device 36 to the right of this, and so on, to the device 37 at the right-hand end of the top line of devices, next the first device 38 in the second line of devices will light up and so on. Accordingly, there is a crude resemblance to a television scan and if the amplitude of the exciting signal is modulated appropriately whilst its frequency is being varied a rudimentary pattern can be displayed. By increasing the number of devices in the array a half-tone picture may be displayed. It is not necessary, however, to simulate a scanning procedure since each device in the array is selected solely by its appropriate frequency in the exciting signal. If the exciting signal contains components of frequencies appropriate to all the devices and if the amplitudes of these components are adjusted individually it is possible to display a symbol or picture in which there is no flicker.

Figure 7:
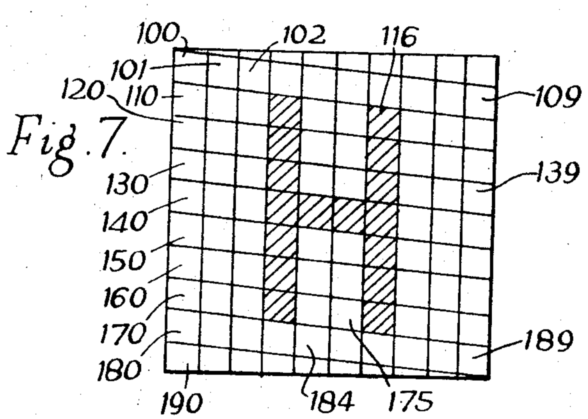
FIG. 7 shows a further two-dimensional array of light-emitting devices in plan view.

A simple arrangement is illustrated in FIG. 7, there being shown schematically a 10 x 10 array similar to the 4 x 4 array shown in FIG. 5. In FIG. 7 the numerals 100, 101 and so on are used to indicate the resonance frequency in kc./s. of each of the devices in the array. It will readily be seen that the letter H represented by shading of certain of the devices can be formed by applying a signal having components at the following frequencies in kc./s.: 113, 123, 133, 143, 153, 163, 173, 116, 126, 136, 146, 156, 166, 176, 144 and 145. An arrangement used to display symbols in this way only requires the components of different frequencies to be switched on and off and it is not necessary to be able to vary the amplitude which the component has when it is switched on. It will be apparent however that if provision is made for modulating the amplitudes of the different components over a range an arrangement such as that shown in FIG. 7 but having a larger number of individual light-emitting devices can be used as the picture display device of a television receiver.

Figure 8:
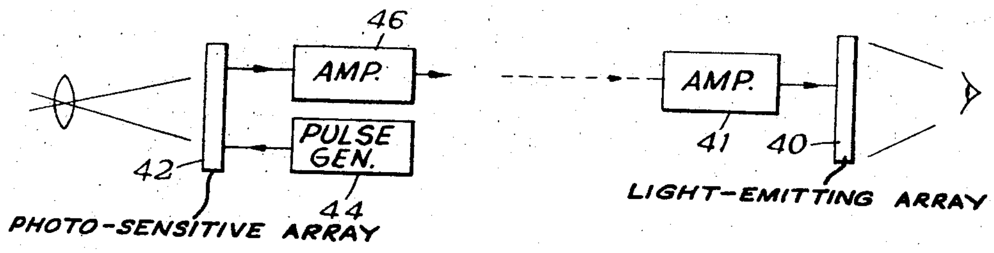
FIG. 8 shows a television system.

Such an arrangement is indicated schematically at 40 in FIG. 8, the exciting signal containing components at the different resonance frequencies being applied thereto by an amplifier 41. Clearly, this exciting signal is of an entirely different nature to that conventionally employed in television systems, being similar to that required in the previously-mentioned system of Fournier d'Albe. In FIG. 8 there is also shown the transmitting part of the system for generating the necessary signal. Thus, an arrangement 42 comprises an array of photo-sensitive devices similar to the light-emitting devices in the arrangement 40. There are the same number of devices in each array similarly arranged in rows and columns and any device in the array 40 and the corresponding device in the array 42 have the same resonance frequencies. This condition can be readily achieved by making the two arrays dimensionally the same.

Figure 9:
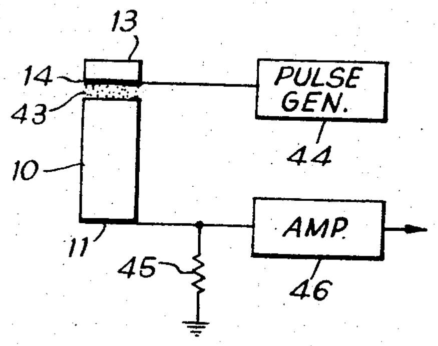
FIG. 9 shows a detail of the television system including a photo-sensitive device.

The individual devices in the arrangement 42 differ from the devices shown in FIG. 1, in that the electroluminescent layer 12 of FIG. 1 is replaced by a layer 43 (FIG. 9) of photo-conductive material. The other elements of the device shown in FIG. 9 have been given the same reference numerals as were used in FIG. 1. As shown in FIG. 9, a pulse generator 44 is connected to apply a signal to the conducting layers 14 of the devices (the conducting layers of all devices being connected together). Furthermore, a common load resistor 45 is connected to all of the conductors 11 and the signal generated across this resistor is applied to an amplifier 46. The signal applied by the pulse generator 44 will be assumed to contain a component at the resonance frequency of the block 10 of FIG. 9. Current can accordingly flow through the layer 43, the block 10 and the load 45 to earth, but the amplitude of this current (which will be at the resonance frequency appropriate to the block 10) will depend upon the prevailing conductivity of the layer 43. Accordingly, the current is controlled by the incident light.

Considering the complete array of devices, it can be seen that the signal developed across the common load 45 will contain components at all the resonance frequencies, the amplitudes of these components being determined individually by the amount of light incident upon the individual devices in the arrangement. The signal is amplified by the amplifier 46 and transmitted to the amplifier 41 by any suitable means.

The means 44 for applying the signal to all the photosensitive devices is shown to be a pulse generator since the output of a pulse generator can be designed to have components at all the required resonance frequencies. For example, the 10 x 10 array shown in FIG. 7 requires resonance frequencies of 100 to 100 kc./s. by steps of 1 kc./s. By the method of the Fournier analysis it can be shown that a voltage pulse of duration 5 microseconds with a repetition rate of 1 kc. will have all the required components.

Figure 10:
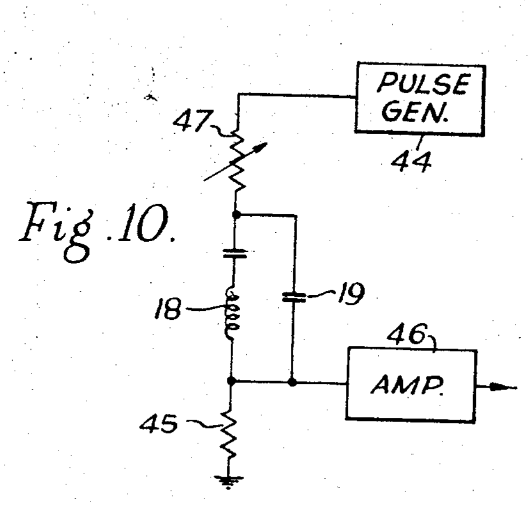
FIG. 10 shows an equivalent circuit.

The equivalent circuit of the device shown in FIG. 9 is represented in FIG. 10, the photo-conductive layer 43 being represented by a variable resistance 47. This is in series with the resonant circuit 18 representing the resonant block 10 and with the load resistor 45. The circuit 18 is shunted by the stray capacitances 19. With this circuit the current through the resistance 45 will be at a maximum when the frequency of the signal applied from the pulse generator 44 is such as to cause the tuned circuit 18 to resonate in the series mode and this current will be proportional to the conductivity of the resistances 47 representing the photo-conductive layer.

It will be understood that this television system provides many outstanding advantages. The picture display device can be thin and suitable for placing against the wall, for instance, and the whole receiver is basically very simple since there is no necessity for scanning or synchronizing circuits. The picture will have no flicker.

I claim:

1. A frequency-sensitive light-emitting device comprising two terminals, a resonant body of piezo-electric material having first and second portions individually polarized in directions at right angles to each other, said terminals being connected at spaced apart locations to the said first portion for application of an exciting field in the direction of polarization of said first portion, an electroluminescent layer in physical contact with and electrically in circuit with said second portion and means for applying across said terminals an alternating voltage, whereby the said layer is excited to luminescence when the said body is caused to resonate by an applied alternating voltage of frequency sufficiently close to a resonance frequency of the said piezo-electric body.

2. A frequency-sensitive light-emitting device comprising two terminals, two resonant bodies of different resonance frequencies of piezo-electric material, each having first and second parts polarized in directions at right angles, said terminals being connected to both said first parts in common for the application to each of an exciting field in the direction of polarization of said first parts, said two second parts being spaced apart to form an interstice, a quantity of electroluminescent material in said interstice and means for applying across said terminals an alternating voltage, whereby when the frequency of said alternating voltage is at a resonance frequency of one of said bodies and said one body resonates, the electroluminescent material is excited to luminescence by a potential difference developed across said interstice between said second parts.

3. A frequency-sensitive light-emitting device comprising a plurality of electroluminescent layers and means permitting each layer to luminese in response to an applied alternating voltage only when the frequency of the said voltage has a value which is different for each electroluminescent layer, the said means including a wedge-shaped block of piezoelectric material divided by a plurality of parallel slots into a plurality of individual piezoelectric bodies having different resonant frequencies, the slots dividing adjacent bodies being arranged in opposing pairs and extending partially into said block from opposite converging faces thereof, and interconnecting piezoelectric bridges interposed between said opposing slots and connecting said adjacent piezoelectric bodies, each electroluminescent layer being affixed to one end of the block associated with the corresponding piezoelectric body.

4. A frequency-sensitive light-emitting device comprising a plurality of electroluminescent layers and means permitting each layer to luminese in response to an applied alternating voltage only when the frequency of the said voltage has a value which is different for each electroluminescent layer, the said means including a piezoelectric slab tapering in thickness in one direction divided by a first set of slots cut into the converging faces of the slab in opposing pairs and extending substantially along said one direction and a second set of slots cut into the converging faces of the slab in opposing pairs and skewed across the slots of said first set to produce a substantially rectangular array of said piezoelectric bodies, each electroluminescent layer being affixed to one end of the block associated with the corresponding piezoelectric body.

References Cited by the Examiner

UNITED STATES PATENTS

| | | | |
|---|---|---|---|
| 1,808,137 | 6/1931 | Hartley | 178—6 |
| 1,996,241 | 4/1935 | Grimes | 310—9.6 |
| 2,816,236 | 12/1957 | Rosen | 315—55 X |
| 2,911,539 | 11/1959 | Tanenbaum | 250—211 |
| 2,923,828 | 2/1960 | Bernath | 250—211 |
| 2,942,131 | 6/1960 | Diemer | 315—169 |
| 2,945,984 | 7/1960 | Yando | 313—108 |
| 2,951,168 | 8/1960 | Yando | 313—108 X |
| 2,976,447 | 3/1961 | McNaney | 313—108 |
| 2,981,858 | 4/1961 | O'Connell | 313—108 |

OTHER REFERENCES

A.P.C. application of Toulon, Serial No. 108,062, published May 18, 1943 (Toulon Digest).

JOHN W. HUCKERT, *Primary Examiner.*

NEWTON W. LOVEWELL, ELI J. SAX, *Examiners.*